United States Patent
Hara et al.

(10) Patent No.: US 10,332,768 B2
(45) Date of Patent: Jun. 25, 2019

(54) COMPACT MANUFACTURING DEVICE, AND INTER-DEVICE TRANSPORT SYSTEM FOR PRODUCTION LINE

(71) Applicant: NATIONAL INSTITUTE OF ADVANCED INDUSTRIAL SCIENCE AND TECHNOLOGY, Chiyoda-ku, Tokyo (JP)

(72) Inventors: Shiro Hara, Tsukuba (JP); Hitoshi Maekawa, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 29 days.

(21) Appl. No.: 15/531,962

(22) PCT Filed: Dec. 1, 2015

(86) PCT No.: PCT/JP2015/083828
§ 371 (c)(1),
(2) Date: May 31, 2017

(87) PCT Pub. No.: WO2016/088786
PCT Pub. Date: Jun. 9, 2016

(65) Prior Publication Data
US 2017/0309507 A1    Oct. 26, 2017

(30) Foreign Application Priority Data

Dec. 1, 2014   (JP) .................................. 2014-243315

(51) Int. Cl.
*H01L 21/677*    (2006.01)
*H01L 21/687*    (2006.01)

(52) U.S. Cl.
CPC ...... *H01L 21/67745* (2013.01); *H01L 21/677* (2013.01); *H01L 21/6773* (2013.01);
(Continued)

(58) Field of Classification Search
CPC .............. H01L 21/677; H01L 21/6773; H01L 21/67736; H01L 21/67727;
(Continued)

(56) References Cited

U.S. PATENT DOCUMENTS

2002/0044860 A1   4/2002   Hayashi
2002/0154977 A1   10/2002  Yoo
(Continued)

FOREIGN PATENT DOCUMENTS

JP    9-36195     2/1997
JP    2012-54414  3/2012
(Continued)

OTHER PUBLICATIONS

International Written Opinion of the International Searching Authority, PCT/ISA/237, dated Feb. 16, 2016, in corresponding International Patent Application No. PCT/JP2015/083828.
International Search Report dated Feb. 16, 2016, in corresponding International Patent Application No. PCT/JP2015/083828.
Extended European Search Report dated Jun. 14, 2018, in corresponding European Patent Application No. 15864366.8.

*Primary Examiner* — Ronald P Jarrett
(74) *Attorney, Agent, or Firm* — Staas & Halsey LLP

(57) ABSTRACT

A compact manufacturing device to automatically transport a wafer transport container. The compact manufacturing device comprises a processing chamber and a device front chamber provided inside a housing, a container mounting table provided in the housing to mount a substrate transport container accommodating a processing substrate, and a container transport mechanism. The container transport mechanism delivers the substrate transport container to the adjacent compact manufacturing device along a container transport path and/or receives the substrate transport con-
(Continued)

tainer from adjacent compact manufacturing device along the container transport path when a plurality of the compact manufacturing devices are provided in parallel.

16 Claims, 2 Drawing Sheets

(52) U.S. Cl.
CPC .. *H01L 21/67736* (2013.01); *H01L 21/67742* (2013.01); *H01L 21/68785* (2013.01); *H01L 21/67727* (2013.01); *H01L 21/67766* (2013.01)

(58) Field of Classification Search
CPC ......... H01L 21/67742; H01L 21/67745; H01L 21/67766; H01L 21/6875
See application file for complete search history.

(56) References Cited

U.S. PATENT DOCUMENTS

| | | | |
|---|---|---|---|
| 2004/0052624 | A1 | 3/2004 | Miyano et al. |
| 2012/0118845 | A1* | 5/2012 | Wada ........................ B61B 3/02 212/71 |
| 2013/0167339 | A1 | 7/2013 | Hara et al. |
| 2015/0311101 | A1 | 10/2015 | Hara et al. |

FOREIGN PATENT DOCUMENTS

| | | |
|---|---|---|
| JP | 2014-110358 | 6/2014 |
| JP | 2014-110359 | 6/2014 |
| WO | WO 2014/087760 A1 | 6/2014 |

\* cited by examiner

COMPACT MANUFACTURING DEVICE, AND INTER-DEVICE TRANSPORT SYSTEM FOR PRODUCTION LINE

CROSS-REFERENCE TO RELATED APPLICATION

This application is a U.S. National Stage Application which claims the benefit under 35 U.S.C. § 371 of PCT International Patent Application No. PCT/JP2015/083828, filed Dec. 1, 2015, which claims the foreign priority benefit under 35 U.S.C. § 119 of Japanese Patent Application No. 2014-243315, filed Dec. 1, 2014, the contents of which are incorporated herein by reference.

TECHNICAL FIELD

The present invention particularly relates to a compact manufacturing device such as a semiconductor manufacturing device for manufacturing a semiconductor wafer having a small diameter of 20 mm or less.

BACKGROUND ART

Conventionally, semiconductor manufacturing techniques have sought to reduce chip manufacturing unit prices by increasing wafer diameters. For this reason, semiconductor manufacturing devices used in a series of manufacturing processes have continued to become larger and gone on a path of rising prices, thus increasing scales of manufacturing plants, and construction and operation costs. Such a large-scale manufacturing system may contribute to a reduction of manufacturing unit prices for small-lot large volume production of chips, but may hardly respond to demands for small-volume multi-kind production, making it difficult to adjust a production volume in accordance with a market situation and also making new entries by small-to-medium-sized enterprises more difficult.

In order to solve these problems, there is a demand for a compact semiconductor manufacturing device capable of manufacturing a semiconductor chip at low cost using a small-diameter (e.g., having a diameter of 20 mm or less) semiconductor wafer. When a production line is constructed using such a compact semiconductor manufacturing device, a plurality of semiconductor manufacturing devices are arranged on a floor surface in parallel in a straight line and a semiconductor wafer is accommodated in a wafer transport container and transported between the plurality of semiconductor manufacturing devices in a series of manufacturing processes on the semiconductor wafer (e.g., see Japanese Patent Applications Laid Open No. 2014-110358 and No. 2014-110359).

In the production line made up of a plurality of the semiconductor manufacturing devices, in order to efficiently advance the series of manufacturing processes on the semiconductor wafer, the wafer transport container needs to be transported automatically among the plurality of semiconductor manufacturing devices. To do so, one set of transport rails may be arranged in the vicinity of the production line over an overall length of the production line and the wafer transport container may be transported among the plurality of semiconductor manufacturing devices using the transport rails.

SUMMARY OF INVENTION

Technical Problem

However, the method using this one set of transport rails has the following problems.

First, since it is difficult to adjust positions of the transport rail and the semiconductor manufacturing devices (particularly, position adjustment in a direction perpendicular to the transport rails), the transport system becomes complicated, delicate and unstable. That is, since the transport rails are very long, basically one set of transport rails are used for many semiconductor manufacturing devices, and the transport rails are fixed to a ceiling or floor, and therefore there is basically no flexibility in the positions of the transport rails. Therefore, when the semiconductor manufacturing devices located on the floor are shifted even slightly, transport errors are more likely to occur. Furthermore, when the floor on which the semiconductor manufacturing devices are arranged is not quite flat, the positions of the semiconductor manufacturing devices are more likely to shift from the transport rails and adjustment takes time and effort.

Second, the size of the transport system increases and the cost thereof increases. That is, when the semiconductor manufacturing devices are away from the transport rail, positioning of the semiconductor manufacturing devices thereby becomes more difficult and a greater allowable range needs to be taken to position the transport container. Furthermore, since the semiconductor manufacturing devices are away from the transport rail, the transport container needs to be hung from the ceiling and lowered or transported to the semiconductor manufacturing devices from a remote place using a robot, which complicates the transport system. This leads to enlargement of the semiconductor manufacturing devices and the transport system, and also causes deterioration of accuracy. A mobile transporter for transporting the transport container is further needed on the transport rails in addition to the semiconductor manufacturing device and the transport rail.

For an ultra-compact system such as a minimal fab in particular, a size reduction of the whole system is indispensable. When the transport rails are made to creep over the ceiling of a plant, the transport rails are located very far, that is, the moving distance of the transport container between the transport rails and the semiconductor manufacturing devices are relatively too long for the size of the semiconductor manufacturing device, the size of the wafer, and the size of the container, which makes the problem of high cost tangible.

Third, it takes approximately 1 to 10 minutes to transport the wafer transport container. That is, the transport rails are fixed and even when a direction switching device is created, it is not possible to arrange an infinite number of such direction switching devices, and it is thereby not possible to transport the wafer transport container in a shortest possible path between the semiconductor manufacturing devices. Since it is essentially different from a human-carried system, it is not possible to obtain a degree of freedom achieved by a human transport path.

The present invention has been implemented in view of such circumstances, and it is an object of the present invention to provide a technique capable of automatically transporting a wafer transport container between a plurality of compact manufacturing devices such as semiconductor manufacturing devices in a production line made up of these compact manufacturing devices without causing the above-described various problems.

Solution to Problem

In order to attain the above-described object, an invention according to claim 1 is a compact manufacturing device including a processing chamber and an device front chamber provided inside a housing, a container mounting table provided in the housing to mount a substrate transport container accommodating a processing substrate, the processing substrate being carried in, when the processing substrate is processed, from the container mounting table and transported into the processing chamber via the device front chamber, processed in the processing chamber, and then returned to the container mounting table from the processing chamber via the device front chamber and carried out, in which container transport means is provided integrally with the housing, and when a plurality of the compact manufacturing devices are provided in parallel, a container transport path extending in a direction in which the plurality of compact manufacturing devices are arranged in parallel is formed so as to penetrate the plurality of compact manufacturing devices, the substrate transport container is delivered to the adjacent compact manufacturing device along the container transport path or the substrate transport container is received from the adjacent compact manufacturing device, and the container transport means is configured to be common to the plurality of compact manufacturing devices.

In an invention according to claim 2, in addition to the configuration according to claim 1, the container transport means is detachably attached to the housing.

Furthermore, in an invention according to claim 3, in addition to the configuration according to claim 1 or 2, a recess, a front surface side and a side surface side of which are opened, and which is recessed from the front surface in a depth direction is formed above the device front chamber in the housing, and the container mounting table and the container transport means are provided in the recess.

Furthermore, in an invention according to claim 4, in addition to the configuration according to any one of claims 1 to 3, the housing is provided with a temporary placement tray to temporarily hold the substrate transport container, and the container transport means is configured to be able to transport the substrate transport container between the container mounting table and the temporary placement tray, and transport, when a plurality of the compact manufacturing devices are provided in parallel, the substrate transport container between the container mounting table of an arbitrary compact manufacturing device and the temporary placement tray of the compact manufacturing device adjacent to the compact manufacturing device.

Furthermore, in an invention according to claim 5, in addition to the configuration according to claim 4, when a plurality of the compact manufacturing devices are provided in parallel, the temporary placement tray is provided so as to locate between the container mounting table of an arbitrary compact manufacturing device and the container mounting table of the compact manufacturing device adjacent to the compact manufacturing device.

Furthermore, in an invention according to claim 6, in addition to the configuration according to any one of claims 1 to 5, the container transport means is provided with a transport rail to transport the substrate transport container along the container transport path.

Furthermore, in an invention according to claim 7, in addition to the configuration according to any one of claims 3 to 5, the container transport means is housed in the recess in such a state that the container transport means does not protrude out of an outline of the housing when not in use.

Furthermore, in an invention according to claim 8, in addition to the configuration according to any one of claims 1 to 7, the container transport means is configured so as not to protrude ahead of the outline of the housing when in use.

Advantageous Effects of Invention

According to the present invention, in a production line made up of a plurality of compact manufacturing devices such as semiconductor manufacturing devices, it is possible to automatically transport a wafer transport container between these compact manufacturing devices. As a result, it is possible to efficiency advance a series of manufacturing processes on a processing substrate such as a semiconductor wafer.

Moreover, it is possible to avoid problems caused by the prior arts that arrange one set of transport rails in the vicinity of the production line. That is, since transport between the compact manufacturing devices is carried out between adjacent compact manufacturing devices, a spatial position of the container transport means can be determined only between the adjacent compact manufacturing devices. Furthermore, since the transport distance corresponds to an interval between the compact manufacturing devices, the transport path becomes shortest and transport between the compact manufacturing devices is carried out very fast (e.g., on the order of 5 seconds). Furthermore, since the container transport means is of a detachable cassette type, in the event of trouble or when free transport is desirable to be carried out, that is, when the substrate transport container is taken to a required place between the compact manufacturing devices, it is also possible to switch to manual transport at any time and construct a production line without the container transport means. Furthermore, when the temporary placement tray is present, the temporary placement tray can add a positioning function, and thereby eliminates the necessity for a transport robot to have a positioning mechanism, and can thereby make up for poor positional accuracy between the compact manufacturing devices.

DESCRIPTION OF EMBODIMENTS

Hereinafter, embodiments of the present invention will be described.

Embodiment 1 of Invention

Figure 1A:
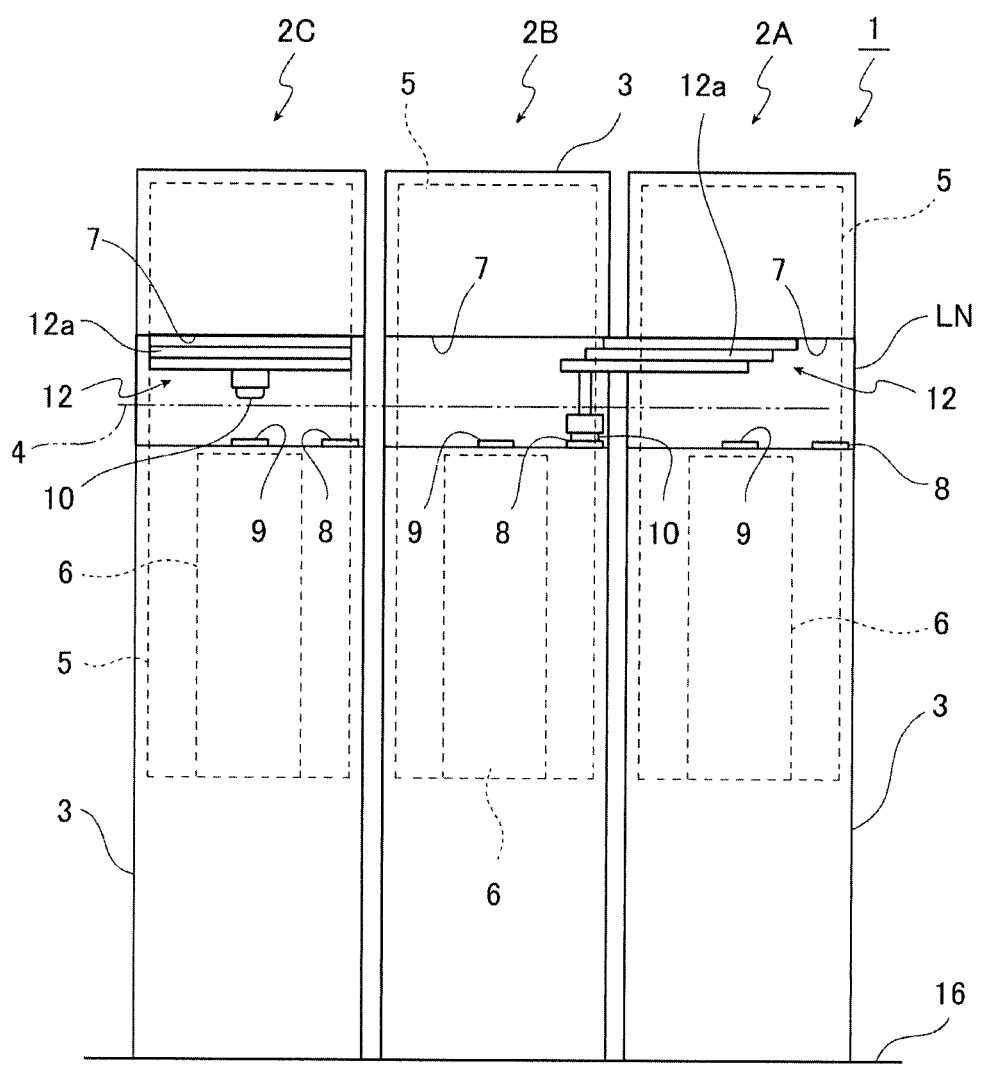
FIG. 1A is a diagram illustrating a front view of a production line according to Embodiment 1 of the present invention.
Figure 1B:
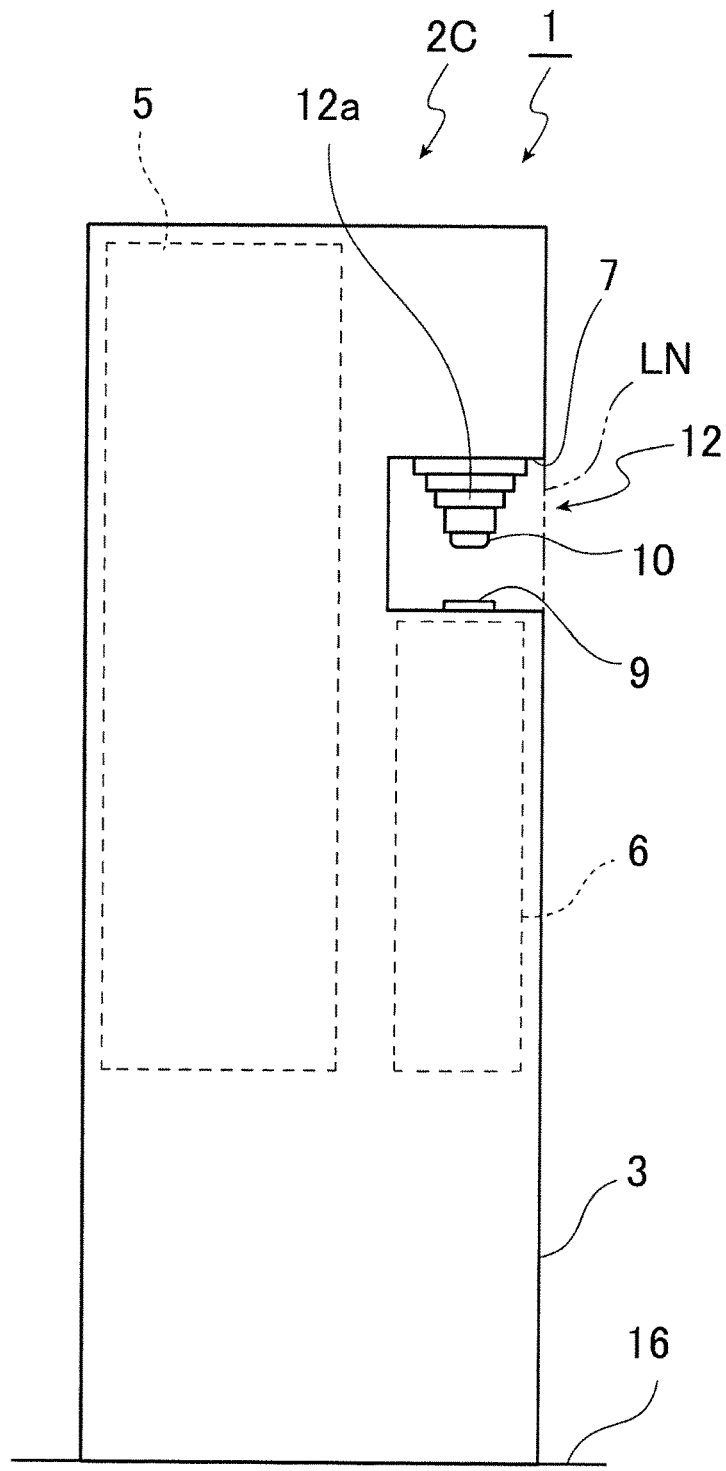
FIG. 1B is a diagram illustrating a left side view of a production line according to Embodiment 1 of the present invention.

FIGS. 1A and 1B illustrate Embodiment 1 of the present invention. Note that FIG. 1(*a*) omits illustration of container transport means of a central semiconductor manufacturing device.

As shown in FIGS. 1A and 1B, a production line 1 according to Embodiment 1 is constructed of three compact semiconductor manufacturing devices (compact manufacturing devices) 2 arranged on a floor surface 16 in parallel in a straight line in present Embodiment 1. These three semiconductor manufacturing devices 2 (right-side semiconductor manufacturing device 2A, center semiconductor manufacturing device 2B and left-side semiconductor manufacturing device 2C) are arranged so as to face each other sideways across gaps formed at predetermined intervals (e.g., 6 mm).

As shown in FIGS. 1A and 1B, each semiconductor manufacturing device 2 includes a substantially rectangular parallelepiped housing 3 of a predetermined size (e.g., width of 30 centimeter, depth of 45 centimeter and height of 144 centimeter), and a processing chamber 5 and a device front chamber 6 are arranged inside each housing 3.

A recess 7 is formed above each device front chamber 6 in a front portion of the housing 3 as shown in FIGS. 1A and 1B. A front surface side and a side surface side of the recess 7 are opened and recessed from the front surface in a depth direction. The recess 7 accommodates a container mounting table 9 to mount a wafer transport container (substrate transport container) 10 in which a small-diameter (e.g., diameter of 20 mm or less) semiconductor wafer is accommodated in a hermetically closed state and a temporary placement tray 8 to temporarily hold the wafer transport container 10. Here, the temporary placement tray 8 is provided as shown in FIG. 1A, in such a way that when a plurality of semiconductor manufacturing devices 2 are arranged in parallel, the temporary placement tray 8 is located between the container mounting table 9 of an arbitrary semiconductor manufacturing device 2 and the container mounting table 9 of the adjacent semiconductor manufacturing device 2. Furthermore, in the arbitrary semiconductor manufacturing device 2, a positional relationship (width direction, depth direction and height direction of the housing) between the container mounting table 9 and the temporary placement tray 8 is determined accurately.

When a plurality of the semiconductor manufacturing devices 2 are arranged in parallel, a container transport path 14 that extends in the direction in which the plurality of semiconductor manufacturing devices 2 are arranged in parallel (left/rightward direction in FIG. 1A) is formed so as to penetrate the recesses 7 of the plurality of semiconductor manufacturing devices 2.

Detachable cassette type container transport means 12 is formed integrally with the housing 3, and the container transport means 12 is provided with a transport rail 12a to transport the wafer transport container 10 along the container transport path 14. This container transport means 12 is configured to be able to transport the wafer transport container 10 back and forth between the temporary placement tray 8 and the container mounting table 9 of the same semiconductor manufacturing device 2 and to transport the wafer transport container 10 back and forth between the container mounting table 9 of the same semiconductor manufacturing device 2 and the temporary placement tray 8 of the adjacent semiconductor manufacturing device 2.

Note that as shown in FIGS. 1A and 1B, when not in use, the container transport means 12 is housed in the recess 7 in such a state that the container transport means 12 does not protrude out either frontward (rightward in FIG. 1B) or in the left/rightward direction (left/rightward direction in FIG. 1A) from a rectangular parallelepiped outline LN of the housing 3 of the semiconductor manufacturing device 2. When in use (when transporting the wafer transport container 10), the container transport means 12 is configured so as not to protrude frontward (rightward in FIG. 1B) from the rectangular parallelepiped outline LN of the housings 3 of the semiconductor manufacturing device 2 and the adjacent semiconductor manufacturing device 2 as shown in FIGS. 1A and 1B.

Since the production line 1 has the above-described configuration, when a series of manufacturing processes are applied to a semiconductor wafer on this production line 1, for example, as will be described below, the series of manufacturing processes are applied to the semiconductor wafer accommodated in this wafer transport container 10 while transporting the wafer transport container 10 sequentially from the right-side semiconductor manufacturing device 2A through the center semiconductor manufacturing device 2B to the left-side semiconductor manufacturing device 2C.

In a first processing step, in the right-side semiconductor manufacturing device 2A, a semiconductor wafer is transported from the container mounting table 9 through the device front chamber 6 into the processing chamber 5, then subjected to predetermined processing in the processing chamber 5, returned to the container mounting table 9 from the processing chamber 5 through the device front chamber 6 and carried out.

Next, the process proceeds to a first transport step. The container transport means 12 of the right-side semiconductor manufacturing device 2A and the container transport means 12 of the center semiconductor manufacturing device 2B operate together to temporarily place the wafer transport container 10 from the container mounting table 9 of the right-side semiconductor manufacturing device 2A onto the temporary placement tray 8 of the center semiconductor manufacturing device 2B, and the wafer transport container 10 is then transported from the temporary placement tray 8 of the center semiconductor manufacturing device 2B to the container mounting table 9 of the center semiconductor manufacturing device 2B.

After that, the process proceeds to a second processing step. In the center semiconductor manufacturing device 2B, a semiconductor wafer is carried from the container mounting table 9 through the device front chamber 6 into the processing chamber 5, subjected to predetermined processing in the processing chamber 5, and then returned from the processing chamber 5 through the device front chamber 6 to the container mounting table 9 and carried out.

Next, the process proceeds to a second transport step. The container transport means 12 of the center semiconductor manufacturing device 2B and the container transport means 12 of the left-side semiconductor manufacturing device 2C operate together to temporarily place the wafer transport container 10 from the container mounting table 9 of the center semiconductor manufacturing device 2B onto the temporary placement tray 8 of the left-side semiconductor manufacturing device 2C, and the wafer transport container 10 is then transported from the temporary placement tray 8 of the left-side semiconductor manufacturing device 2C to the container mounting table 9 of the left-side semiconductor manufacturing device 2C and placed thereon.

Lastly, the process proceeds to a third processing step. In the left-side semiconductor manufacturing device 2C, the semiconductor wafer is carried from the container mounting table 9, transported through the device front chamber 6 into the processing chamber 5, subjected to predetermined processing in the processing chamber 5, then returned from the processing chamber 5 through the device front chamber 6 to the container mounting table 9 and carried out.

A series of manufacturing processes on the semiconductor wafer end here.

Note that there can be a variety of specific transport schemes for the wafer transport container 10. As a first transport scheme, a mechanism is provided in which instead of the wafer transport container 10 traveling on the transport rail 12a, the wafer transport container 10 is detachably held at a distal end of the transport rail 12a, and the transport rail 12a expands or shrinks or changes its angle to thereby transport the wafer transport container 10 to an adjacent semiconductor manufacturing device 2. As a second transport scheme, there is a transport scheme under which the wafer transport container 10 travels on the transport rail 12a and the wafer transport container 10 is delivered to the transport rail 12a of an adjacent semiconductor manufacturing device 2. As a third transport scheme, there is a transport scheme under which a transport robot (not shown) transports the wafer transport container 10 to an adjacent semiconductor manufacturing device 2. In this case, the wafer transport container 10 is not directly received between the transport robots, but is temporarily placed on the temporary placement tray 8 and the transport robot of the adjacent semiconductor manufacturing device 2 thereby picks up and transports the wafer transport container 10 via the temporary placement tray 8.

A procedure has been described in the aforementioned series of manufacturing processes where while sequentially transporting the wafer transport container 10, a series of manufacturing processes are applied to the semiconductor wafer, but, in addition to such a sequence, it is also possible to apply a series of manufacturing processes to the semiconductor wafer while transporting the wafer transport container 10 in an arbitrary sequence.

For example, it is also possible to apply a series of manufacturing processes to the semiconductor wafer while transporting the wafer transport container 10 in the production line 1, for example, using a reverse procedure to the aforementioned sequence, from the left-side semiconductor manufacturing device 2C through the center semiconductor manufacturing device 2B to the right-side semiconductor manufacturing device 2A.

Furthermore, it is also possible to apply a series of manufacturing processes to the semiconductor wafer while transporting the wafer transport container 10 in the production line 1, in a sequence of the left-side semiconductor manufacturing device 2C, the right-side semiconductor manufacturing device 2A and the center semiconductor manufacturing device 2B. In this case, when transporting the wafer transport container 10 from the left-side semiconductor manufacturing device 2C to the right-side semiconductor manufacturing device 2A, it may be possible to transport the wafer transport container 10 from the left-side semiconductor manufacturing device 2C through the center semiconductor manufacturing device 2B to the right-side semiconductor manufacturing device 2A or transport the wafer transport container 10 directly from the left-side semiconductor manufacturing device 2C to the right-side semiconductor manufacturing device 2A (that is, without going through the center semiconductor manufacturing device 2B).

In this way, when applying a series of manufacturing processes to the semiconductor wafer while transporting the wafer transport container 10 in various sequences, by providing the semiconductor wafer or wafer transport container 10 with processing information on this semiconductor wafer (information on which semiconductor manufacturing device 2 among the three semiconductor manufacturing devices 2 is used and in which sequence processing is proceeded) as a tag such as RFID or barcode, it is possible to smoothly advance the series of manufacturing processes. Alternatively, it may also be possible to provide the semiconductor wafer or wafer transport container 10 with only an ID instead of the processing information on the semiconductor wafer and store the processing information on the semiconductor wafer linked with the ID in a computer (not shown) for predetermined step management.

As described above, in the series of manufacturing processes on the semiconductor wafer, the container transport means 12 of the three semiconductor manufacturing devices 2 constituting the production line 1 operate together to transport the wafer transport container 10 between these semiconductor manufacturing devices 2. As a result, it is possible to automatically transport the wafer transport container 10 among the three semiconductor manufacturing devices 2 and efficiently advance the series of manufacturing processes on the semiconductor wafer. Furthermore, since each semiconductor manufacturing device 2 is provided with the temporary placement tray 8, when a plurality of semiconductor wafers are continuously processed on the production line 1, by temporarily placing the wafer transport container 10 on the temporary placement tray 8 in the middle of a series of manufacturing processes on each semiconductor wafer, it is possible to shorten the waiting time of the container transport means 12 or, by extension, a required time of all of the series of manufacturing processes on all the semiconductor wafers.

Moreover, it is possible to avoid problems caused by the prior art that places one set of transport rails in the vicinity of the production line 1. That is, since transport between the semiconductor manufacturing devices 2 is carried out between the adjacent semiconductor manufacturing devices 2, the spatial position of the container transport means 12 can be determined only with respect to the adjacent semiconductor manufacturing device 2. That is, without regard to remote semiconductor manufacturing devices 2, even when a plant building is distorted due to a change over the time, disaster or the like, transport is substantially not affected. Furthermore, since the transport distance of the semiconductor wafer (wafer transport container 10) corresponds to the interval between the semiconductor manufacturing devices 2, the transport path becomes shortest and transport between the semiconductor manufacturing devices 2 is carried out very fast (on the order of 5 seconds). Moreover, since the container transport means 12 is of a detachable cassette type, in the event of trouble or when free transport is desired to be carried out, that is, when the substrate transport container is taken to a required place between the semiconductor manufacturing devices 2, it is also possible to switch to manual transport at any time and construct the production line 1 without the container transport means 12. Furthermore, when the temporary placement tray 8 is present, the temporary placement tray 8 can add a positioning function, and thereby eliminates the necessity for the transport robot to have a positioning mechanism, and can thereby make up for poor positional accuracy between the semiconductor manufacturing devices 2.

Furthermore, on the production line 1, the temporary placement tray 8 is located between the container mounting tables 9 of the two adjacent semiconductor manufacturing devices 2 as shown in FIG. 1A, and it is thereby possible to offset a movable range of the container transport means 12 unlike the case where the wafer transport container 10 is directly transported (without going through the temporary placement tray 8) between the container mounting tables 9, and thus reduce constraints on the design or manufacturing of the mechanism. That is, the container transport means 12 needs only to set a range up to the temporary placement tray 8 of the adjacent semiconductor manufacturing device 2 as a movable range, and such a range need not reach the container mounting table 9 of the adjacent semiconductor manufacturing device 2.

Furthermore, when not in use, the container transport means 12 is housed in the recess 7 in such a state that the container transport means 12 does not protrude out either frontward or left/rightward from the rectangular parallelepiped outline LN of the housing 3 of the semiconductor manufacturing device 2 as described above, and therefore when the production line 1 is constructed by arranging the three semiconductor manufacturing devices 2 in parallel, it is possible to smoothly perform installation or replacement of these semiconductor manufacturing devices 2.

Furthermore, as described above, when in use, the container transport means 12 is configured not to protrude frontward from the rectangular parallelepiped outline LN of the housings 3 of the semiconductor manufacturing device 2 and the adjacent semiconductor manufacturing device 2, and it is thereby possible to avoid situations in which the container transport means 12 becomes an impediment to an operator when transporting the wafer transport container 10 between the semiconductor manufacturing devices 2 using the container transport means 12.

During transport of the wafer transport container 10, since the semiconductor wafer is always accommodated in the wafer transport container 10 in a hermetically closed state, it is possible to avoid the risk that minute particles in the air will intrude into the wafer transport container 10 and stick to the semiconductor wafer. That eliminates the necessity to hermetically close the entire production line 1 and makes it possible to construct the production line 1 at low cost.

Other Embodiments of Invention

Note that the production line 1 constructed of three semiconductor manufacturing devices 2 has been described in aforementioned Embodiment 1, but the number of semiconductor manufacturing devices 2 constituting the production line 1 is not limited to three, and the number of semiconductor manufacturing devices 2 may be any number if it is plural (two or more).

A case has been described in aforementioned Embodiment 1 where the present invention is applied to a small-diameter semiconductor wafer, but the present invention is likewise applicable to semiconductor wafers having a large diameter of 8 inches, 12 inches or the like.

Although the semiconductor manufacturing device 2 using a semiconductor wafer has been described in aforementioned Embodiment 1 as an example, the present invention is likewise applicable to a manufacturing device that manufactures a device from other types of substrate (e.g., insulating substrate such as sapphire substrate, conductive substrate such as aluminum substrate) or non-disk-shaped (e.g., rectangular) processing substrate.

INDUSTRIAL APPLICABILITY

The present invention is not only applicable to a semiconductor manufacturing device but also widely applicable to a production line in various fields where multi-kind and small-quantity production is performed.

REFERENCE SIGNS LIST

1 . . . Production line
2 . . . Semiconductor manufacturing device (compact manufacturing device)
3 . . . Housing
5 . . . Processing chamber
6 . . . Device front chamber
7 . . . Recess
8 . . . Temporary placement tray
9 . . . Container mounting table
10 . . . Wafer transport container (substrate transport container)
12 . . . Container transport means
12a . . . Transport rail
14 . . . Container transport path
16 . . . Floor surface
LN . . . Outline of housing

The invention claimed is:

1. A manufacturing device comprising:
a housing having a recess that is recessed and opened from both a front surface and a side surface of the housing;
a container mounting table accommodated in the recess;
a transport rail accommodated in the recess;
a front chamber inside the housing below the container mounting table; and
a processing chamber inside the housing, wherein
the container mounting table, the front chamber and the processing chamber are configured so that a substrate transport container transporting a substrate is mountable on the container mounting table, the substrate is transportable from the container mounting table via the front chamber into the processing chamber for processing of the substrate in the processing chamber, and the processed substrate is returnable from the processing chamber via the front chamber to the container mounting table, and
the transport rail is configurable to, when another manufacturing device is adjacent to the manufacturing device, operate together with a transport rail of the another manufacturing device to perform at least one of
deliver the substrate transport container transporting the returned, processed substrate from the container mounting table of the manufacturing device into a recess of a housing of the another manufacturing device and position the delivered substrate transport container on a container mounting table of the another manufacturing device for processing of the substrate in a processing chamber of the another manufacturing device, and
receive a substrate transport container transporting a substrate having been processed in the processing chamber of the another manufacturing device into the recess of the manufacturing device and position the received substrate transport container on the container mounting table of the manufacturing device for processing of the substrate transported by the received substrate transport container in the processing chamber of the manufacturing device.

2. The manufacturing device according to claim 1, further comprising a cassette container transport mechanism which is detachably attached to the housing of the manufacturing device and includes the transport rail of the manufacturing device.

3. The manufacturing device according to claim 2, wherein the cassette container transport mechanism is housed in the recess of the manufacturing device in such a state that the cassette container transport mechanism does not protrude out of an outline of the housing of the manufacturing device when not operating together with the transport rail of the another manufacturing device.

4. The manufacturing device according to claim 1, wherein the housing of the manufacturing device and the housing of the another manufacturing device have the same shape, and the recess of the manufacturing device and the recess of the another manufacturing device have the same shape.

5. The manufacturing device according to claim 1, wherein the housing of the manufacturing device comprises a temporary placement tray to temporarily hold the substrate transport container before being mounted on the container mounting table of the manufacturing apparatus, and the transport rail of the manufacturing device is configured to transport the substrate transport container from the temporary placement tray of the manufacturing device to the container mounting table of the manufacturing device, and to transport the substrate transport container from the container mounting table of the manufacturing device to a temporary placement tray of the another manufacturing device.

6. The manufacturing device according to claim 5, wherein the temporary placement tray of the manufacturing device is provided so as to locate between the container mounting table of the manufacturing device and the container mounting table of the another manufacturing device.

7. The manufacturing device according to claim 1, wherein the transport rail of the manufacturing device is configured so as not to protrude forward of the outline of the housing of the manufacturing device when operating together with the transport rail of the another manufacturing device.

8. An apparatus comprising:
first and second manufacturing devices, each including
a housing having a recess that is recessed and opened from both a front surface and a side surface of the housing,
a container mounting table accommodated in the recess,
a transport rail accommodated in the recess,
a front chamber inside the housing below the container mounting table, and
a processing chamber inside the housing, wherein
the container mounting table, the front chamber and the processing chamber are configured so that a substrate transport container transporting a substrate is mountable on the container mounting table, the substrate is transportable from the container mounting table via the front chamber into the processing chamber for processing of the substrate in the processing chamber, and the processed substrate is returnable from the processing chamber via the front chamber to the container mounting table, and
the transport rail of the first manufacturing device is configurable to, when the second manufacturing device is adjacent to the first manufacturing device, operate together with the transport rail of the second manufacturing device to perform at least one of
deliver the substrate transport container transporting the returned, processed substrate from the container mounting table of the first manufacturing device into the recess of the housing of the second manufacturing device and position the delivered substrate transport container on the container mounting table of the second manufacturing device for processing of the substrate in the processing chamber of the second manufacturing device, and receive a substrate transport container transporting a substrate having been processed in the processing chamber of the second manufacturing device into the recess of the first manufacturing device and position the received substrate transport container on the container mounting table of the first manufacturing device for processing of the substrate transported by the received substrate transport container in the processing chamber of the first manufacturing device.

9. A manufacturing device comprising:
a housing having a recess that is recessed and opened from both a front surface and a side surface of the housing;
a container mounting table accommodated in the recess;
a transport robot accommodated in the recess;
a front chamber inside the housing below the container mounting table; and
a processing chamber inside the housing, wherein
the container mounting table, the front chamber and the processing chamber are configured so that a substrate transport container transporting a substrate is mountable on the container mounting table, the substrate is transportable from the container mounting table via the front chamber into the processing chamber for processing of the substrate in the processing chamber, and the processed substrate is returnable from the processing chamber via the front chamber to the container mounting table, and
the transport robot is configurable to, when another manufacturing device is adjacent to the manufacturing device, operate together with a transport robot of the another manufacturing device to perform at least one of
deliver the substrate transport container transporting the returned, processed substrate from the container mounting table of the manufacturing device into a recess of a housing of the another manufacturing device and position the delivered substrate transport container on a container mounting table of the another manufacturing device for processing of the substrate in a processing chamber of the another manufacturing device, and
receive a substrate transport container transporting a substrate having been processed in the processing chamber of the another manufacturing device into the recess of the manufacturing device and position the received substrate transport container on the container mounting table of the manufacturing device for processing of the substrate transported by the received substrate transport container in the processing chamber of the manufacturing device.

10. The manufacturing device according to claim 9, further comprising a cassette container transport mechanism which is detachably attached to the housing of the manufacturing device and includes the transport robot of the manufacturing device.

11. The manufacturing device according to claim 10, wherein the cassette container transport mechanism is housed in the recess of the manufacturing device in such a state that the cassette container transport mechanism does not protrude out of an outline of the housing of the manufacturing device when not operating together with the transport robot of the another manufacturing device.

12. The manufacturing device according to claim 9, wherein
the housing of the manufacturing device and the housing of the another manufacturing device have the same shape, and
the recess of the manufacturing device and the recess of the another manufacturing device have the same shape.

13. The manufacturing device according to claim 9, wherein
the housing of the manufacturing device comprises a temporary placement tray to temporarily hold the substrate transport container before being mounted on the container mounting table of the manufacturing apparatus, and
the transport robot of the manufacturing device is configured to transport the substrate transport container from the temporary placement tray of the manufacturing device to the container mounting table of the manufacturing device, and to transport the substrate transport container from the container mounting table of the manufacturing device to a temporary placement tray of the another manufacturing device.

14. The manufacturing device according to claim 13, wherein the temporary placement tray of the manufacturing device is provided so as to locate between the container mounting table of the manufacturing device and the container mounting table of the another manufacturing device.

15. The manufacturing device according to claim 9, wherein the transport robot of the manufacturing device is configured so as not to protrude forward of the outline of the housing of the manufacturing device when operating together with the transport robot of the another manufacturing device.

16. An apparatus comprising:
first and second manufacturing devices, each including
a housing having a recess that is recessed and opened from both a front surface and a side surface of the housing,
a container mounting table accommodated in the recess,
a transport robot accommodated in the recess,
a front chamber inside the housing below the container mounting table, and
a processing chamber inside the housing, wherein
the container mounting table, the front chamber and the processing chamber are configured so that a substrate transport container transporting a substrate is mountable on the container mounting table, the substrate is transportable from the container mounting table via the front chamber into the processing chamber for processing of the substrate in the processing chamber, and the processed substrate is returnable from the processing chamber via the front chamber to the container mounting table, and
the transport robot of the first manufacturing device is configurable to, when the second manufacturing device is adjacent to the first manufacturing device, operate together with the transport robot of the second manufacturing device to perform at least one of
deliver the substrate transport container transporting the returned, processed substrate from the container mounting table of the first manufacturing device into the recess of the housing of the second manufacturing device and position the delivered substrate transport container on the container mounting table of the second manufacturing device for processing of the substrate in the processing chamber of the second manufacturing device, and
receive a substrate transport container transporting a substrate having been processed in the processing chamber of the second manufacturing device into the recess of the first manufacturing device and position the received substrate transport container on the container mounting table of the first manufacturing device for processing of the substrate transported by the received substrate transport container in the processing chamber of the first manufacturing device.

* * * * *